United States Patent [19]
Moench

[11] Patent Number: 5,307,352
[45] Date of Patent: Apr. 26, 1994

[54] SWITCH MATRIX MULTIPLEXERS

[75] Inventor: Jerry D. Moench, Austin, Tex.

[73] Assignee: Advanced Micro Devices, Inc., Sunnyvale, Calif.

[21] Appl. No.: 24,521

[22] Filed: Mar. 1, 1993

[51] Int. Cl.⁵ .............................................. H04J 3/02
[52] U.S. Cl. .................................. 370/112; 307/243; 328/104
[58] Field of Search ..................... 370/85.1, 85.6, 112; 328/104, 152, 154; 307/241, 242, 243

[56] References Cited

U.S. PATENT DOCUMENTS

| | | | |
|---|---|---|---|
| 4,390,988 | 6/1983 | Best et al. ........................ | 370/112 X |
| 4,551,634 | 11/1985 | Takahashi et al. ............. | 370/112 X |
| 4,577,124 | 3/1986 | Koike ............................. | 307/243 X |
| 4,709,173 | 11/1987 | Nishimichi et al. ............ | 307/243 |
| 4,757,218 | 7/1988 | Nawaki .......................... | 307/448 X |
| 4,868,413 | 9/1989 | Oakland et al. ................ | 307/243 |
| 5,001,367 | 3/1991 | Vinal ............................... | 307/443 X |
| 5,148,121 | 9/1992 | Uchida .......................... | 328/104 X |

Primary Examiner—Douglas W. Olms
Assistant Examiner—Melvin Marcelo
Attorney, Agent, or Firm—Johnson & Gibbs

[57] ABSTRACT

The present invention teaches an improved multiplexer system wherein more than one wide bus line may be connected to a single bus line, but wherein only one such wide bus line will be so connected. This system includes structure for imposing ordered consideration of each of the more than one wide bus lines to determine whether it should be connected to the single bus line, structure for enabling connecting of one of the wide bus lines to the single bus line, and structure for disabling possible connection of each of the more than one wide bus lines ordered subsequent to the connected wide bus line.

15 Claims, 8 Drawing Sheets

SWITCH MATRIX MULTIPLEXERS

BACKGROUND OF THE INVENTION

1. Field of the Invention

The present invention relates to multiplexers. More particularly, the present invention relates to apparatus and methods for improving the performance of wide multiplexer structures.

2. Description of Related Art

Figure 1:
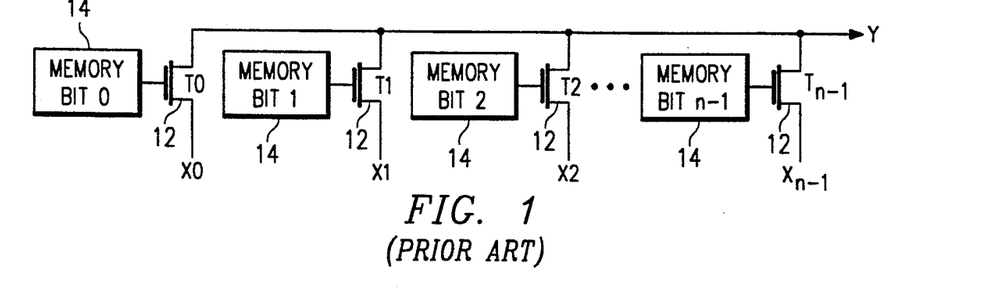
FIG. 1 is a schematic diagram of a prior art circuit that allows the connection of a wide bus to a single bus in a wide multiplexer structure.

It is frequently advantageous in the electronic arts to be able to connect a wide bus (i.e., one having more than one line) to a single line bus. A structure to effect such a connection is shown in FIG. 1. Specifically, in FIG. 1 there is shown a structure (generally designated by reference numeral 10) for connecting an bus having "n" lines to a bus having only one line. The individual lines of the n line bus shown in FIG. 1 are designated X0, X1, X2 ... Xn−1. The line bus shown in FIG. 1 is simply designated Y.

Continuing to refer to FIG. 1, it may be seen that the structure 10 comprises n transistors (each designated by reference numeral 12), one each for each line of the n line bus. In structure 10, a single bit of data effectively controls each of the n transistors 12. These bits are depicted in FIG. 1 in the form of memory bit boxes (each designated by reference numeral 14), each of which is connected to the gate of an associated transistor 12. Each of the bits in the "memory cells" 14 may be enabled, therefore allowing connection of the associated X and the Y line (e.g., enabling memory bit 0 allows connection of line X0 and the Y line) and transmission of data on the relevant X line to the Y line (e.g., X0 to Y in the example being presented).

The structure depicted in FIG. 1 has certain shortcomings, however. It is possible, for example, if any two of the memory cells are on and if they differ, line Y can be in an unknown state. More specifically, as an example, X0 and X1 could differ. If, in such a case, both memory bits 0 and 1 were enabled, the value on line Y would be unknown. Further, there would exist a high current path between lines X0 and X1 in such a case, assuming that both transistors T0 and T1 were enabled and that the transistors were of relatively large values for speed.

Based upon the foregoing, those skilled in the art should recognize and appreciate the shortcomings and deficiencies of prior art structures such as that depicted in FIG. 1.

SUMMARY OF THE INVENTION

The present invention overcomes the shortcomings and deficiencies mentioned above by providing an improved structure for connecting a wide bus to a single bus. The present invention comprises an apparatus and a method wherein and whereby, respectfully, possible contention between memory cells is eliminated.

Accordingly, it is an object of the present invention to provide an apparatus and a method for improving the performance of multiplexer structures wherein wide buses are connected to single buses.

Another object of the present invention is to provide an apparatus and method that eliminates a source of contention and subsequent uncertainty as to bus state in wide multiplexer structures.

BRIEF DESCRIPTION OF THE DRAWINGS

Other objects, advantages, and novel features of the present invention will become apparent from the following detailed description of the invention when taken in conjunction with the accompanying drawings wherein:

FIG. 6 (comprising FIGS. 6a, 6b and 6c) is a detailed schematic diagram of an embodiment of the present invention;

DETAILED DESCRIPTION OF THE INVENTION

Figure 2:
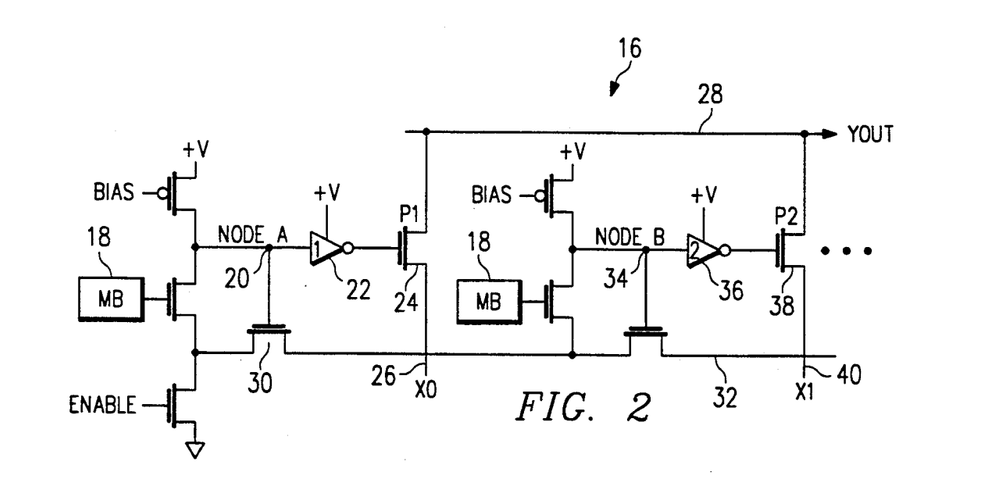
FIG. 2 is a schematic diagram of a circuit according to the teachings of the present invention.

Referring now to the drawings wherein like or similar elements are designated with identical reference numerals throughout the several views and, more particularly, to FIG. 2, there is shown a schematic diagram of a circuit (generally designated by reference numeral 16) according to the teachings of the present invention.

Circuit 16 may be seen in FIG. 2 to comprise a plurality of memory cell bits 18, two of which are shown in FIG. 2. In a preferred embodiment of the present invention, memory cell bits 18 are EE memory cell bits. Memory call bits 18 could, for example, be EPROM bits or flash cell structures or even simply static RAM cells.

Those skilled in the art will appreciate that memory cell bits 18 may be programmed "on" or "off". If, for example, the left-most memory cell bit 18 in FIG. 2 were programmed "on", Node A (designated by reference numeral 20) will be pulled low. Node A 20 being pulled low will, in turn, cause inverter 22 to go high, also pulling pass gate 1 ("P1") (designated by reference numeral 24) high. Pass gate 1 24 going high connects line X0 26 to line YOUT 28.

Continuing this example and continuing to refer to FIG. 2, when Node A 20 is low, the ground line pass gate 30 will also be low, eliminating the ground path 32 to the right-most portion of the circuit (the second "cell") shown in FIG. 2. Eliminating the ground path 32 causes Node B 34 to go high regardless of the programmed state of its associated memory cell bit (i.e., the right-most memory cell bit 18 depicted in FIG. 2). When Node B 34 is high, inverter 2 36 pulls pass gate 2 ("P2") 38 low. With pass gate 2 38 low, connection of line X1 40 and line YOUT 28 is not possible. Therefore, in operation of the circuit depicted in FIG. 2, there is no possibility that multiple cells will be selected on YOUT.

Although only two wide bus lines, x0 and x1, are shown in FIG. 2, those skilled in the art will readily appreciate that any number of such lines, with associated stage elements (i.e., memory cell bits, inverters, etc.), could be connected to form an embodiment of the present invention. The only real limit on the number of "cells" or "stages" that could be so "stacked" is a requirement that the ground path 32 offer low enough resistance that each subsequent cell is pulled low, enabling the associated pass gates.

Figure 3:
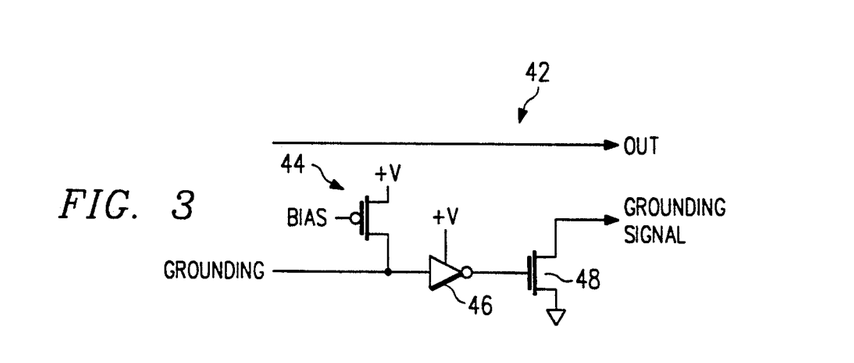
FIG. 3 is a schematic diagram of a circuit for amplifying a grounding signal, which circuit may be employed in embodiments of the present invention.

Referring now to FIG. 3 there is shown a circuit (generally designated by reference numeral 42) that can be employed to amplify the grounding signal in embodiments of the present invention. Circuit 42 comprises a biasing mechanism (generally designated by reference numeral 44), an inverter 46, and a pass gate 48 which interact to effectively amplify the grounding signal and thereby allow a greater number of cells or stages to be stacked.

Based upon the foregoing, those skilled in the art should now understand and appreciate that the present invention provides an ordered method for considering whether to connect each one of a plurality of wide bus lines to a single bus line. The method of the present invention includes the step of disabling all possible subsequent connections once a connection is made. This latter step allows a very wide multiplexer to be created in which it is certain that multi-selection will not occur.

Also based upon the foregoing, those skilled in the art should now understand and appreciate that the present invention provides an improved multiplexer system wherein a plurality of wide bus lines may be connected to a single bus line and wherein each of the plurality of wide bus lines is routed through an individual pass gate before connection to the single bus line. According to the teachings of the present invention, such an improved system includes structure for imposing ordered consideration of each of the plurality of wide bus lines to determine whether it should be connected to the single bus line, structure for enabling connection of a first one of the plurality of wide bus lines to the single bus line, and structure for disabling possible connection of each of the plurality of wide bus lines subsequent to the first one of the plurality of wide bus lines. The apparatus of the present invention is very simple, and thus less expensive to make and more compact than more elaborate systems that could be constructed to perform the same function. The method of the present invention, employing grounding signal expansion, also can be advantageously employed because it is not binary and because any width, or number of input signals, is possible.

Figure 4:
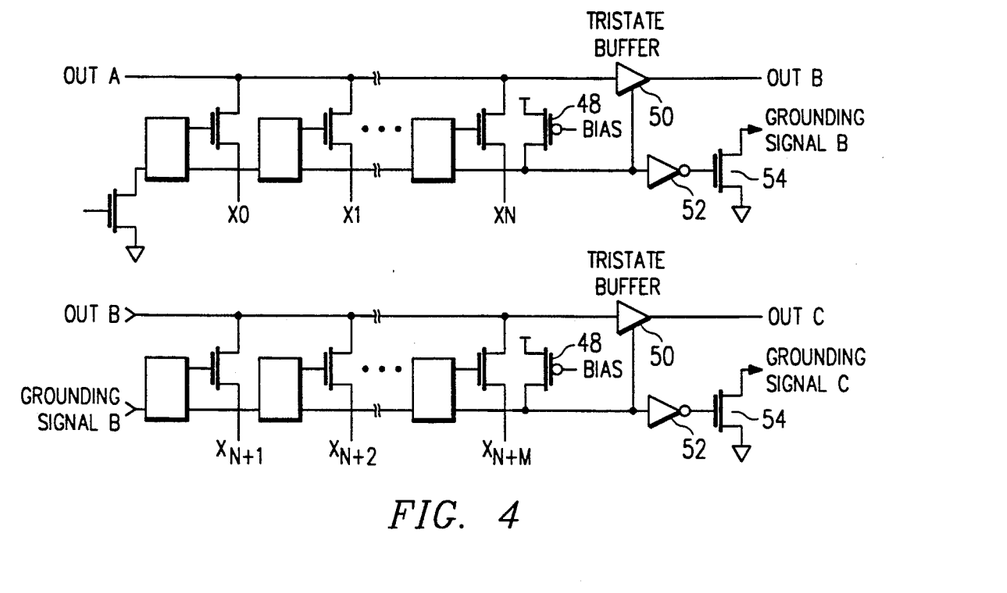
FIG. 4 is a schematic diagram of a buffering circuit that may be employed in embodiments of the present invention.

The inventor of the present invention recognizes that if a multiplexer structure according to the teachings herein were made very wide, additional buffering would improve speed and lower capacitance back to the initial inputs (i.e., X0, X1, etc.). Such buffering could be provided by a circuit scheme such as that depicted in FIG. 4. This buffering circuit scheme comprises multiple stages terminating with a biasing mechanism 48, a tristate buffer 50, an inverter 52, and a grounding signal pass gate 54. In this scheme, the biasing mechanism 48, inverter 52 and grounding signal pass gate 54 are all serially disposed on the grounding line; the tristate buffer 50 is connected in circuit on the output line, with its third point of connection connected between the biasing mechanism 48 and the inverter 52 on the grounding line. FIG. 4 shows two such stages, both referenced identically. It such be appreciated, however, that any number of such stages could be included in an embodiment of the present invention, although the larger the number of such stages, the slower overall circuit performance would be.

Figure 5:
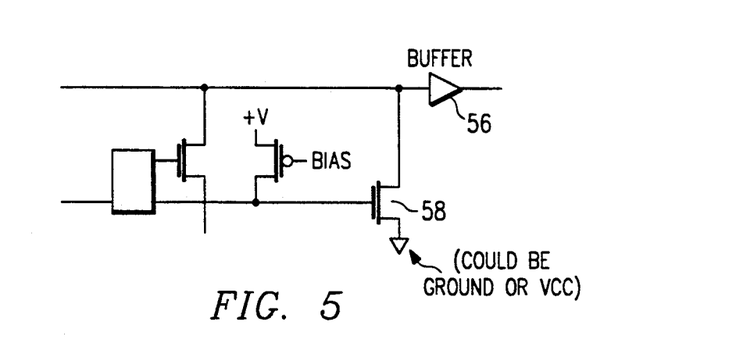
FIG. 5 is a schematic diagram of a final stage deselect circuit that could be employed in embodiments of the present invention.

If a decision is made to include a buffering structure such as that depicted in FIG. 4 in an embodiment of the present invention, the absolute final stage would not require a tristate buffer or a final grounding amplifier. It would still be necessary, though, to make the final stage deselect (that is, pull high or low). This could be effected by the circuit scheme depicted in FIG. 5, which circuit scheme employs a buffer 56 and pass gate 58 disposed in the out line and the grounding line, respectively, as shown.

Although the foregoing is deemed sufficiently descriptive of the present invention to enable those skilled in the art to practice it, FIGS. 6–10 are included herewith to illustrate particular embodiments of the present invention that have heretofore been constructed and tested and been shown to operate very well. The circuits shown in FIGS. 6–10 are presented here as examples only and are not, and should not in any way be construed to be, limiting as to details of practice of the present invention.

Figure 6A:
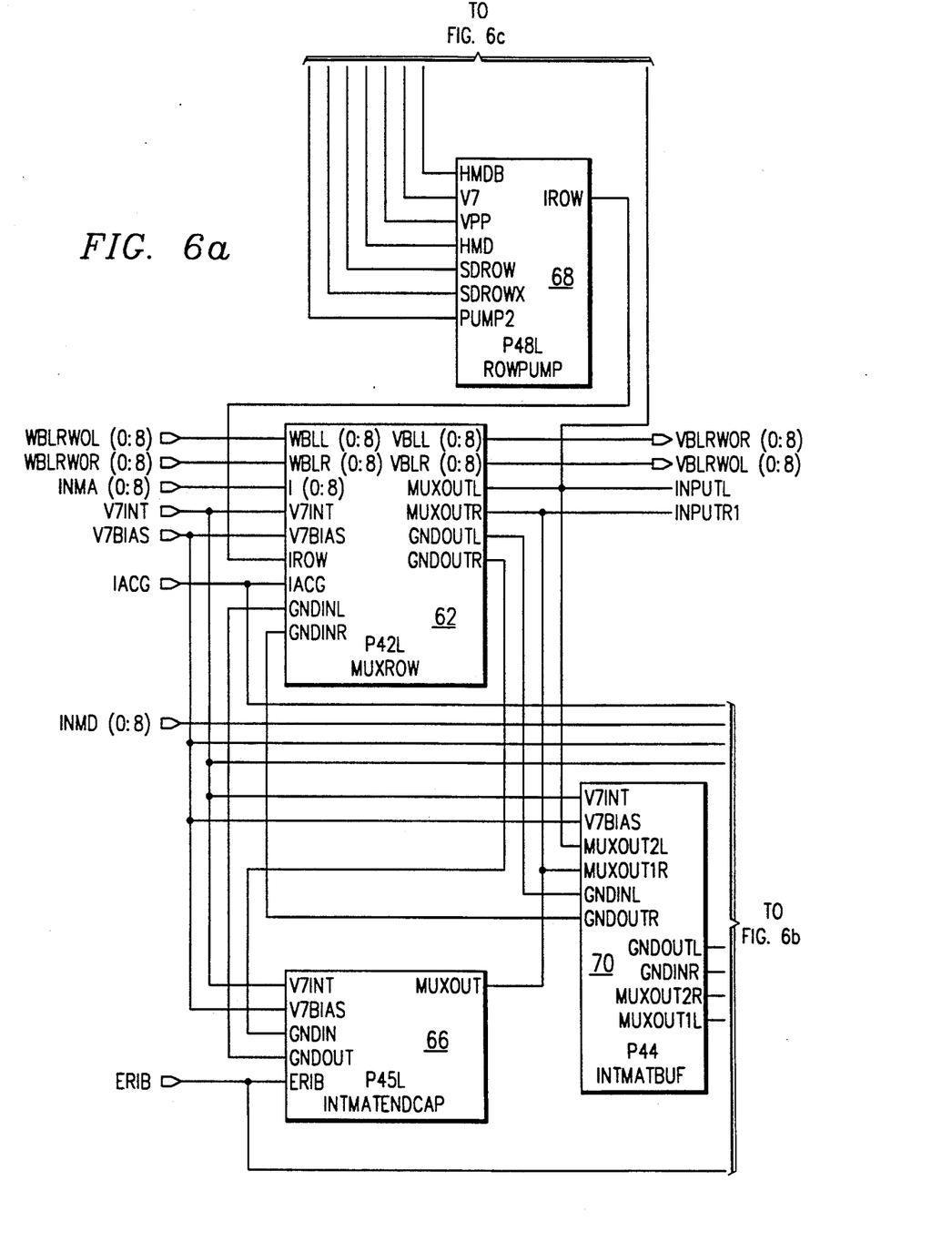
Figure 6B:
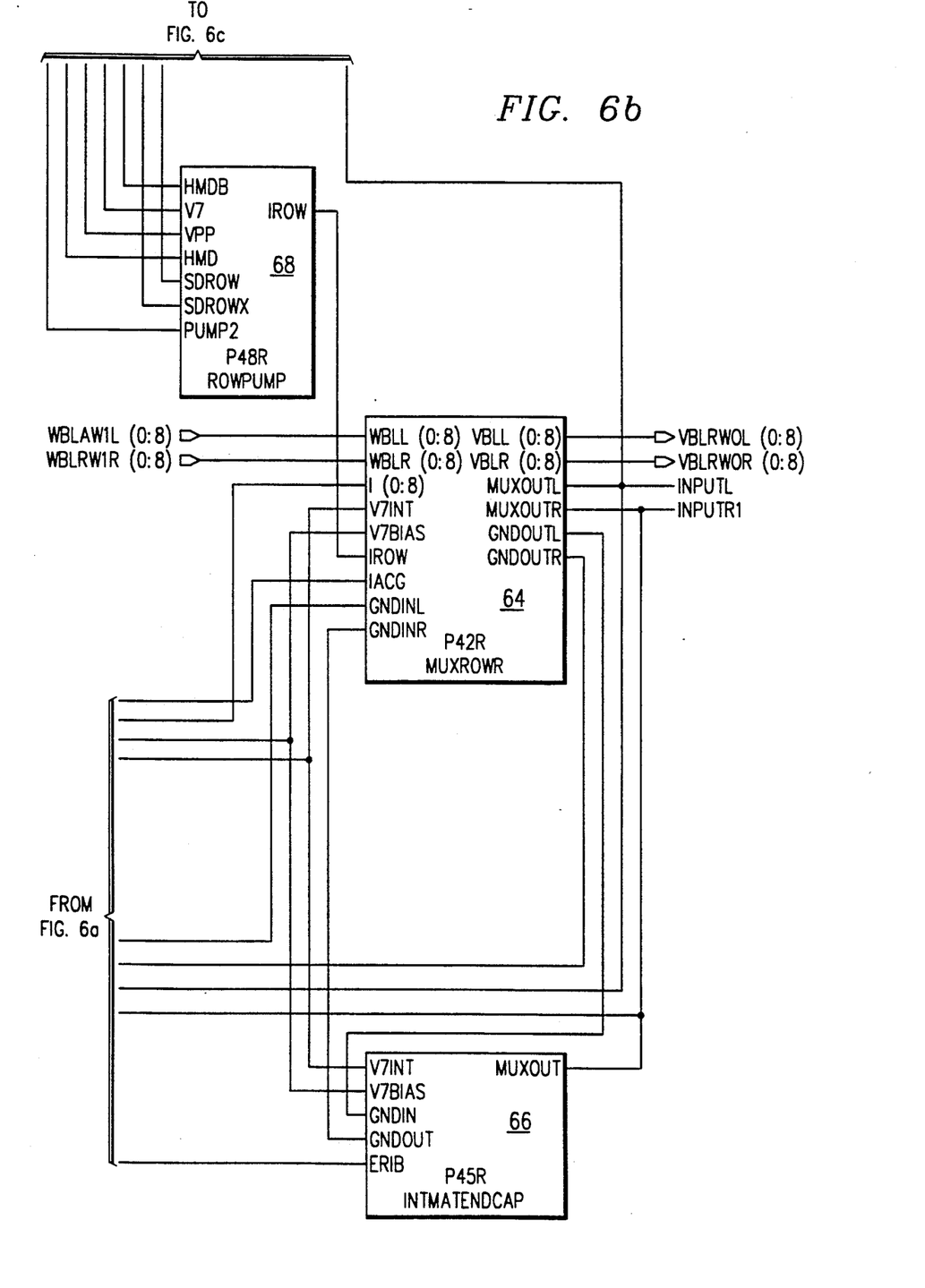
Figure 6C:
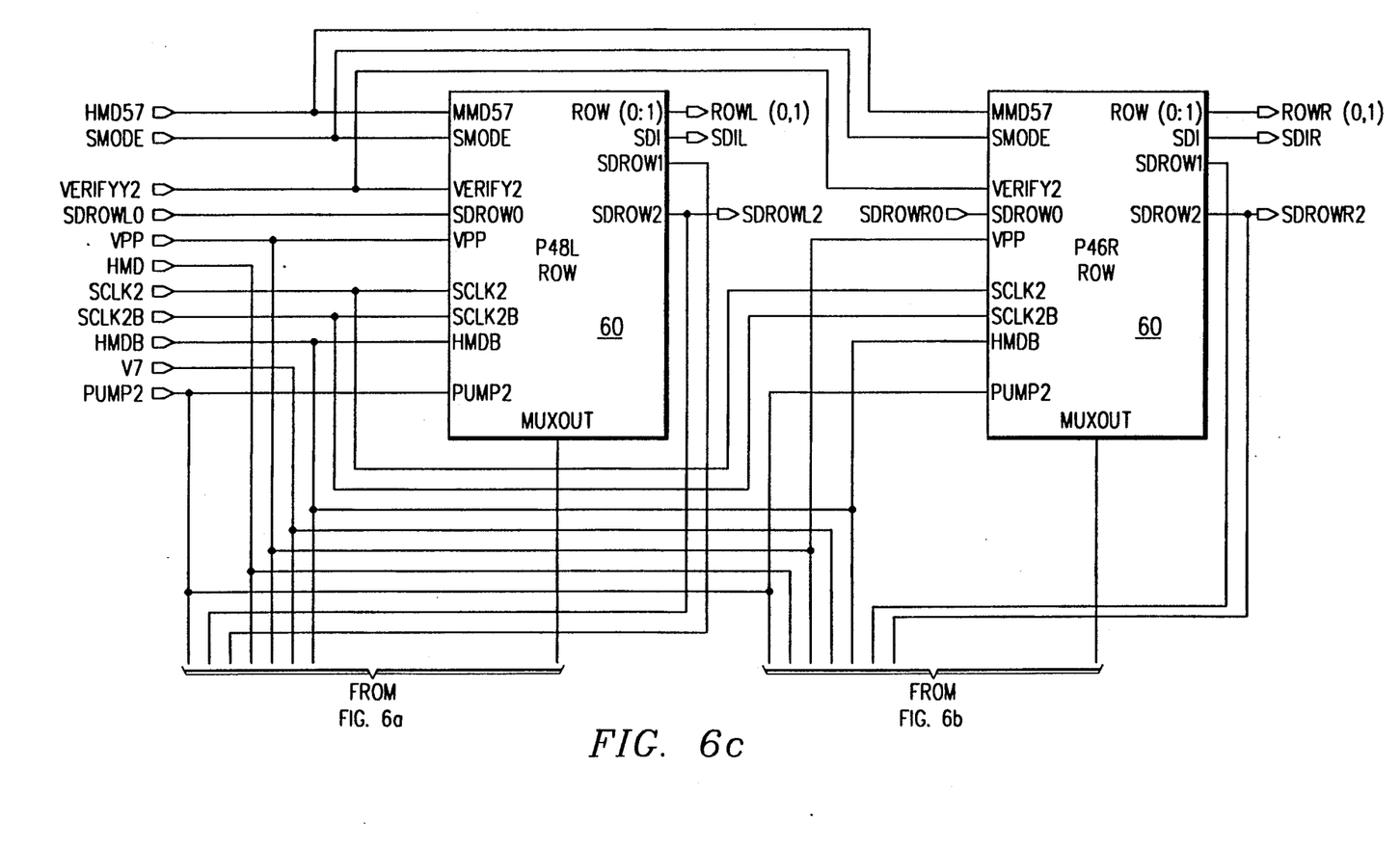
Figure 7:
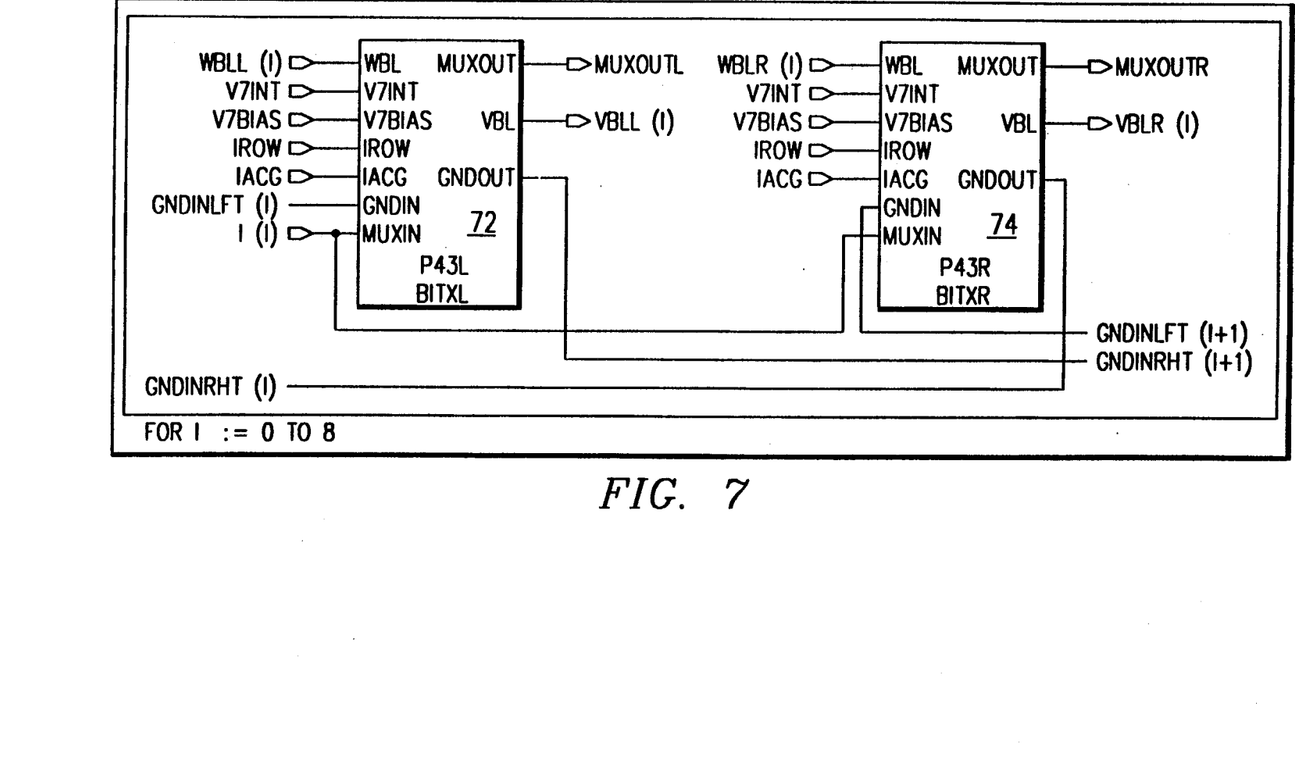
FIG. 7 is a more detailed schematic diagram of one of the elements depicted in FIG. 6.

With the foregoing understood, those skilled in the art will recognize that FIG. 6 depicts, in the form of a detailed circuit diagram, an apparatus according to the teachings of the present invention. The apparatus of FIG. 6 is really quite simple and constructed of very few parts: two MUXOUT elements 60; virtually identical MUXROW and MUXROWR elements 62, 64; two INTMATENDCAP elements 66; two ROWPUMP elements 68; and an INTMATBUF element 70. FIG. 7 depicts an even more detailed view of MUXROW element 62, which is shown therein to essentially comprise a BITXL element 72 and a BITXR element 74. Again, MUXROW element 62, depicted in detail in FIG. 7, is virtually identical to MUXROWR element 64, depicted in FIG. 6.

Figure 8:
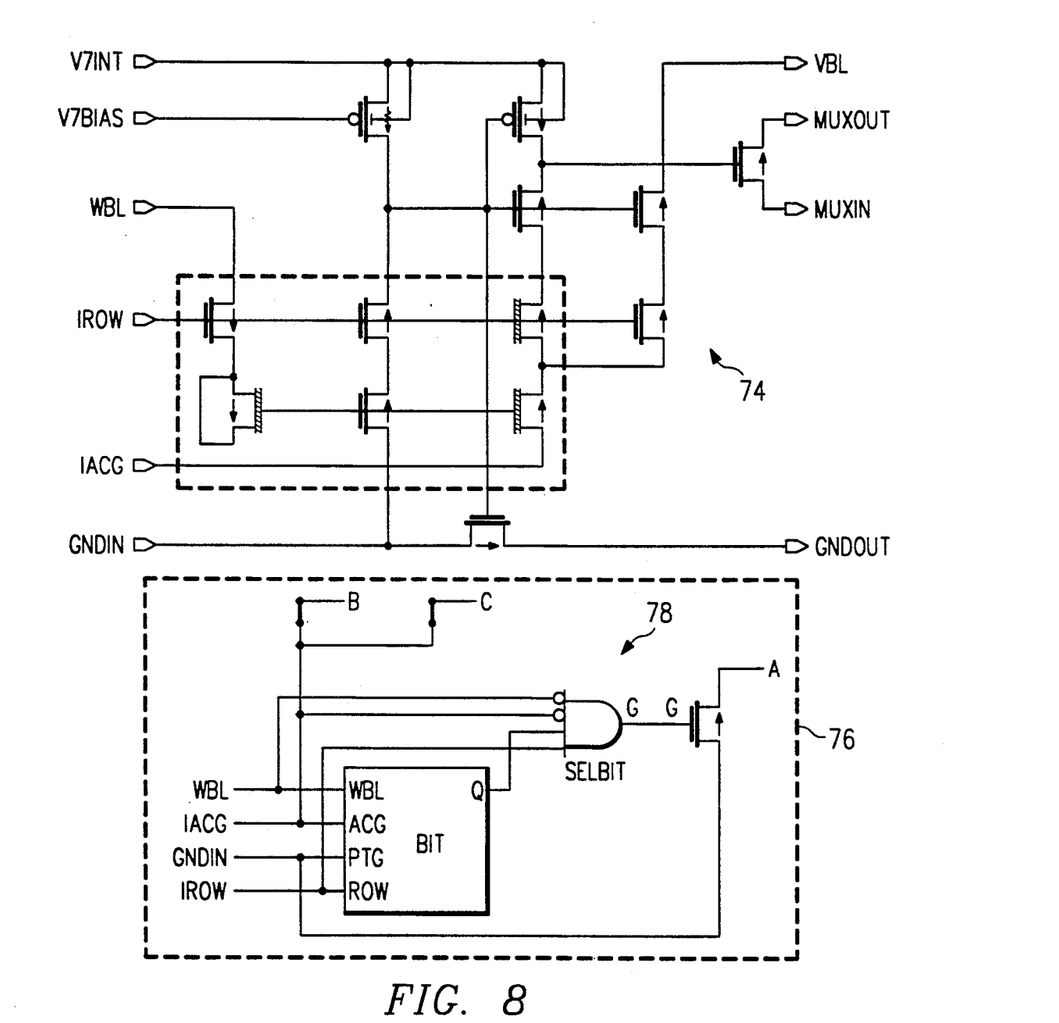
FIG. 8 is an even more detailed schematic diagram of one of the elements depicted in FIG. 7.

Referring now to FIG. 8, there is shown a detailed circuit diagram of the BITXR element 74, a higher level view of which is presented in FIG. 7. Within the block defined by dotted line 76 in FIG. 8 is a transistor 78 that forms essentially the only difference between the BITXR element 74 and the BITXL element 72.

Figure 9:
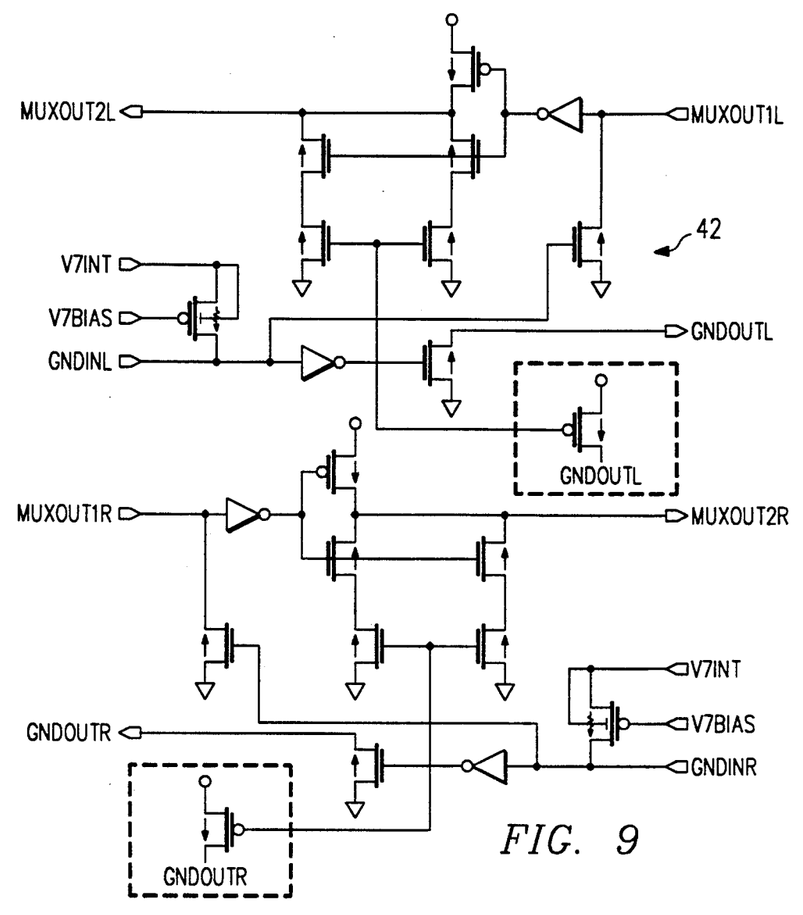
FIG. 9 is a detailed schematic diagram of a grounding signal amplifier circuit that may be included in embodiments of the present invention.
Figure 10:
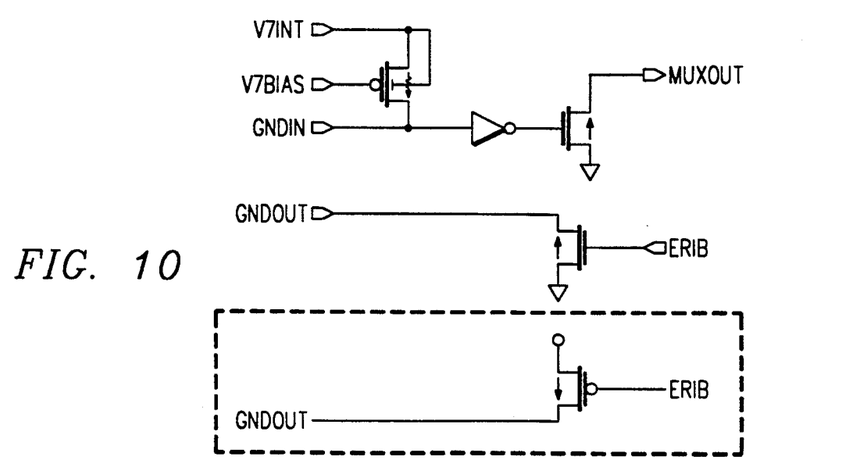
FIG. 10 is a detailed schematic diagram of buffering schemes that may be employed in embodiments of the present invention.

In FIG. 9 there is shown a detailed circuit diagram of a grounding signal amplifier 42, a higher level view of which is presented in FIG. 3. Finally, FIG. 10 depicts buffering and buffering termination schemes, shown and discussed previously in FIGS. 4 and 5 and in the description accompanying those FIGS.

Based upon all of the foregoing, those skilled in the art should now fully understand and appreciate the present invention. The present invention, broadly speaking, provides a method and apparatus for connecting a wide line bus to a single line bus, wherein the connecting of one of the wide bus lines triggers means for disabling possible connection of all other wide bus lines. Performing in this manner, the present invention allows a very wide multiplexer to be created, in which multiplexer it is certain that multi-selection of wide bus lines will not occur.

Obviously, numerous modifications and variations are possible in view of the teachings above. Accordingly, within the scope of the appended claims, the present invention may be practiced otherwise than as specifically described above.

What is claimed is;

1. In a multiplexer system wherein a plurality of wide bus lines may be connected to a single bus line, and wherein each of said plurality of wide bus lines is routed through an individual pass gate before connection to said single bus line, an improvement comprising;

means for imposing order consideration of each of said plurality of wide bus lines to determine whether it should be connected to said single bus line, this ordered consideration creating a first and subsequent relationship among said plurality of wide bus lines;

means for enabling connecting of a first one of said plurality of wide bus lines to said single bus line; and means for disabling possible connection of each said plurality of wide bus lines ordered subsequent to said first one of said plurality of wide bus lines, wherein each of said plurality of wide bus lines has a circuit node associated therewith, said circuit node disposed in circuit between said individual pass gate and a second pass gate in a ground path.

2. The improvement as recited in claim 1, wherein said means for enabling connection of a first one of said plurality of wide bus lines to said single bus line comprises means for causing the circuit node associated with said first one of said plurality of wide bus lines to go low.

3. The improvement as recited in claim 2, wherein said means for enabling connection of a first one of said plurality of wide bus lines to said single bus line further comprises an inverter disposed in circuit between the circuit node associated with said first one of said plurality of wide bus lines and said individual pass gate through which said first one of said plurality of wide bus lines is routed, whereby when said circuit node goes low, said inverter and, subsequently, said individual pass gate go high, connecting said first one of said plurality of wide bus line sot said single bus line.

4. The improvement as recited in claim 3, wherein the circuit node associated with said first one of said plurality of wide bus lines is directly connected to said second pass gate in said ground path, whereby when said circuit node goes low, said second pass gate goes low, effectively terminating the ground path to subsequent wide bus lines.

5. The improvement as recited in claim 1, wherein said means for imposing ordered consideration of each of said plurality of wide bus lines comprises staged memory cells, each of which staged memory cells is associated with one of said plurality of wide bus lines, and each of which is further connected to a ground path through a pass gate.

6. The improvement as recited in claim 5, wherein said means for imposing ordered consideration of each of said plurality of wide bus lines further comprises at least one means for amplifying a grounding signal, which means is connected in circuit in said ground path.

7. The improvement as recited in claim 5, wherein said means for disabling possible connection of each of said plurality of wide bus lines ordered subsequent to said first one of said plurality of wide bus lines comprises means for terminating said ground path to subsequent memory cell stages.

8. The improvement as recited in claim 7, wherein said means for terminating said ground path to subsequent memory cell stages comprises means for pulling the pass gate associated with said one of said plurality of wide bus lines being connected to said single bus line low.

9. The improvement as recited in claim 1, wherein said means for imposing ordered consideration of each of said plurality of wide bus lines comprises staged memory cells, each of which can be connected to a ground path, and further comprising a buffering circuit terminating a plurality of staged memory cells.

10. The improvement as recited in claim 9, wherein said buffering circuit comprises a biasing mechanism, an inverter, and a pass gate all serially disposed on said ground path, and wherein said buffering circuit further comprises a tristate buffer disposed in said single bus line, said tristate buffer having a third point of connection connected between said biasing mechanism and said inverter on said ground path.

11. The improvement as recited in claim 9, wherein said buffering circuit comprises a buffer disposed in said single bus line and a pass gate disposed in said ground path.

12. A method for connecting a plurality of wide bus lines to a single bus line, said method comprising the steps of:

imposing ordered consideration of each of said plurality of wide bus lines to determine whether it should be connected to said single bus lines, this ordered consideration creating a first and subsequent relationship among said plurality of wide bus lines;

enabling connection of a first on of said plurality of wide bus lines to said single bus line; and disabling possible connection of each of said plurality of wide bus lines ordered subsequent to said firs tone of said plurality of wide bus lines, wherein said step of disabling possible connection of each of said plurality of wide bus lines ordered subsequent to said first one of said plurality of wide bus lines comprises the step of terminating a ground path.

13. The method as recited in claim 12, wherein said method further comprises the step of amplifying a grounding signal in said ground path.

14. The method as recited in claim 12, wherein said step of imposing ordered consideration of each of said plurality of wide bus lines comprises the step of forming staged memory cells, one memory cell stage each for each of said plurality of wide bus lines.

15. The method as recited in claim 14, further comprising the step of buffering multiple memory cell stages.

* * * * *